United States Patent
Morioka et al.

(10) Patent No.: US 9,709,761 B2
(45) Date of Patent: Jul. 18, 2017

(54) OPTICAL RECEPTACLE AND OPTICAL MODULE

(71) Applicant: Enplas Corporation, Saitama (JP)

(72) Inventors: Shimpei Morioka, Saitama (JP); Kazutaka Shibuya, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/120,020

(22) PCT Filed: Feb. 16, 2015

(86) PCT No.: PCT/JP2015/054114
§ 371 (c)(1),
(2) Date: Aug. 18, 2016

(87) PCT Pub. No.: WO2015/125729
PCT Pub. Date: Aug. 27, 2015

(65) Prior Publication Data
US 2017/0052333 A1    Feb. 23, 2017

(30) Foreign Application Priority Data
Feb. 21, 2014   (JP) ................................. 2014-031511

(51) Int. Cl.
*G02B 6/26*    (2006.01)
*G02B 6/42*    (2006.01)

(52) U.S. Cl.
CPC ........... *G02B 6/425* (2013.01); *G02B 6/4214* (2013.01); *G02B 6/4239* (2013.01); *G02B 6/4244* (2013.01)

(58) Field of Classification Search
CPC .................................................... G02B 6/425
See application file for complete search history.

(56) References Cited

U.S. PATENT DOCUMENTS 9,244,234 B2 *   1/2016  Tanazawa ............ G02B 6/4286
2006/0002651 A1 *  1/2006  Shimizu ........... B29D 11/00663
                                                              385/14
(Continued)

FOREIGN PATENT DOCUMENTS

JP    034198/1988 A    9/1989
JP    2009-003171 A    1/2009
(Continued)

OTHER PUBLICATIONS

International Search Report from International Application No. PCT/JP2015/054114 mailed Mar. 31, 2015.

*Primary Examiner* — Sung Pak
(74) *Attorney, Agent, or Firm* — Brundidge & Stanger, P.C.

(57) ABSTRACT

The optical receptacle of the invention includes plural first optical surfaces allowing light emitted from plural light emitting elements to be incident thereon, plural second optical surfaces emitting the light incident on the first optical surfaces toward plural optical transmission members, and a third optical surface reflecting the light incident on the first optical surfaces toward the second optical surfaces. The distances between the center of the first optical surface and the light-emitting surface of the light emitting element and between the center of the second optical surface and the light-emitting surface of the light emitting element is longer toward the center from both ends of the row. The center-to-center distances of the first optical surfaces and of the second optical surfaces are shorter, respectively, than the distance between optical axes of light emitted from the light emitting elements and the center-to-center distance of light-receiving surfaces of optical transmission members.

2 Claims, 9 Drawing Sheets

(56) References Cited

U.S. PATENT DOCUMENTS

| | | | |
|---|---|---|---|
| 2011/0097037 A1* | 4/2011 | Kuznia | G02B 6/4214 385/33 |
| 2012/0263416 A1* | 10/2012 | Morioka | G02B 6/4214 385/33 |
| 2014/0029953 A1* | 1/2014 | Otte | G02B 6/4206 398/139 |
| 2014/0079352 A1* | 3/2014 | Lin | G02B 6/4286 385/14 |
| 2014/0328558 A1* | 11/2014 | Morioka | G02B 6/4286 385/33 |
| 2016/0327758 A1* | 11/2016 | Morioka | B29C 45/40 |

FOREIGN PATENT DOCUMENTS

| | | |
|---|---|---|
| JP | 2009-163213 A | 7/2009 |
| JP | 2009-229996 A | 10/2009 |
| JP | 2010-175942 A | 8/2010 |
| JP | 2012-108443 A | 6/2012 |

* cited by examiner

OPTICAL RECEPTACLE AND OPTICAL MODULE

TECHNICAL FIELD

The present invention relates to an optical receptacle and an optical module including the optical receptacle.

BACKGROUND ART

Conventionally, in optical communications using optical transmission members such as optical fibers and light waveguides, optical modules have been used, provided with a light emitting element such as a surface-emitting laser (for example, VCSEL: Vertical Cavity Surface Emitting Laser). Such an optical module includes an optical receptacle that allows light including communication information emitted from a light emitting element to be incident on the end surface of an optical transmission member.

For example, Patent Literature (hereinafter, referred to as "PTL") 1 discloses an optical module including an optical connector and a substrate with light emitting elements disposed thereon. The optical connector includes optical fibers and a connector part, and the connector part includes a lens array (optical receptacle) disposed between the tips of the plurality of the optical fibers and the light emitting elements. The lens array includes a reflecting mirror that reflects light emitted from the light emitting elements toward the optical fiber tips, and a condenser lens that concentrates the light reflected by the reflecting mirror toward the optical fiber tips.

In the optical module disclosed in PTL 1, the optical connector is fixed to the substrate by positioning the optical connector at a certain position in the substrate, applying a thermosetting epoxy resin adhesive onto the boundary between the lens array edges and the substrate, and heat-curing the adhesive.

In an optical module produced in such a manner, light emitted from a light emitting element is reflected by a reflecting mirror toward an optical fiber tip, and reaches the optical fiber tip via a condenser lens.

CITATION LIST

Patent Literature

PTL 1
Japanese Patent Application Laid-Open No. 2010-175942

SUMMARY OF INVENTION

Technical Problem

However, when the epoxy resin adhesive is cured in the optical module disclosed in PTL 1, the lens array is deformed by the shrinkage of the epoxy resin adhesive. As a result, the reflecting mirror is also deformed undesirably. In addition, the condenser lens is also deformed, causing the arrangement thereof to be changed as well. The epoxy resin adhesive is cured with the lens array in the deformed state. The lens array is thus kept in the deformed state even after fixed to the substrate, which may lead to light emitted from the light emitting element not properly guided to the end surface of the optical fiber. As described above, the lens array (optical receptacle) disclosed in PTL 1 is disadvantageously unable to optically connect the light emitting element properly to the optical fiber when being fixed to the substrate with an adhesive.

In light of the above, an object of the present invention is to provide an optical receptacle that can optically connect light emitting elements or light receiving elements to optical transmission members properly even when the optical receptacle is fixed to a substrate using an adhesive. In addition, another object of the present invention is to provide an optical module including the optical receptacle.

Solution to Problem

[1] An optical receptacle of the present invention is disposed between a plurality of light emitting elements or a plurality of light receiving elements arranged at a constant interval and a plurality of optical transmission members arranged at a constant interval and is configured to optically connect the light emitting elements or the light receiving elements to end surfaces of the optical transmission members, respectively, which optical receptacle includes: a plurality of first optical surfaces arranged correspondingly to the light emitting elements or the light receiving elements, the plurality of first optical surfaces each configured such that light emitted from a corresponding one of the light emitting elements is incident on the first optical surface, or each configured to emit light propagating in the first optical surface toward a corresponding one of the light receiving elements; a plurality of second optical surfaces arranged correspondingly to the optical transmission members, the plurality of second optical surfaces each configured to emit the light incident on the first optical surfaces toward an end surface of a corresponding one of the optical transmission members, or each configured such that light from a corresponding one of the optical transmission members is incident on the second optical surface; and a third optical surface configured to reflect the light incident on the first optical surface toward the second optical surface or configured to reflect the light incident on the second optical surface toward the first optical surface, in which a distance between a center of the first optical surface and a virtual plane positioned identically with a light-emitting surface of the light emitting element or with a light-receiving surface of the light receiving element and a distance between a center of the second optical surface and the virtual plane are longer toward a center from both ends of a row of the first optical surfaces and a row of the second optical surfaces, respectively; and a center-to-center distance of two first optical surfaces adjacent in a direction of the row of the first optical surfaces and a center-to-center distance of two second optical surfaces adjacent in a direction of the row of the second optical surfaces are shorter, respectively, than a distance between optical axes of light emitted from oppositely-disposed two adjacent light emitting elements and a center-to-center distance of oppositely-disposed two adjacent light-receiving surfaces of the optical transmission members, or shorter, respectively, than a distance between optical axes of light emitted from oppositely-disposed two adjacent optical transmission members and a center-to-center distance of oppositely-disposed two adjacent light-receiving surfaces of the light receiving elements.

[2] An optical module of the present invention includes a substrate on which a plurality of light emitting elements or a plurality of light receiving elements are arranged at a constant interval; and the optical receptacle according to [1] adhered onto the substrate at a contact point with the substrate.

Advantageous Effects of Invention

According to the present invention, a plurality of light emitting elements or a plurality of light receiving elements can be optically connected properly to a plurality of optical transmission members even when deformation occurs upon adherence to a substrate.

DESCRIPTION OF EMBODIMENTS

Hereinafter, embodiments of the present invention will be described in detail with reference to the accompanying drawings.

(Configuration of Optical Module)

Figure 1:
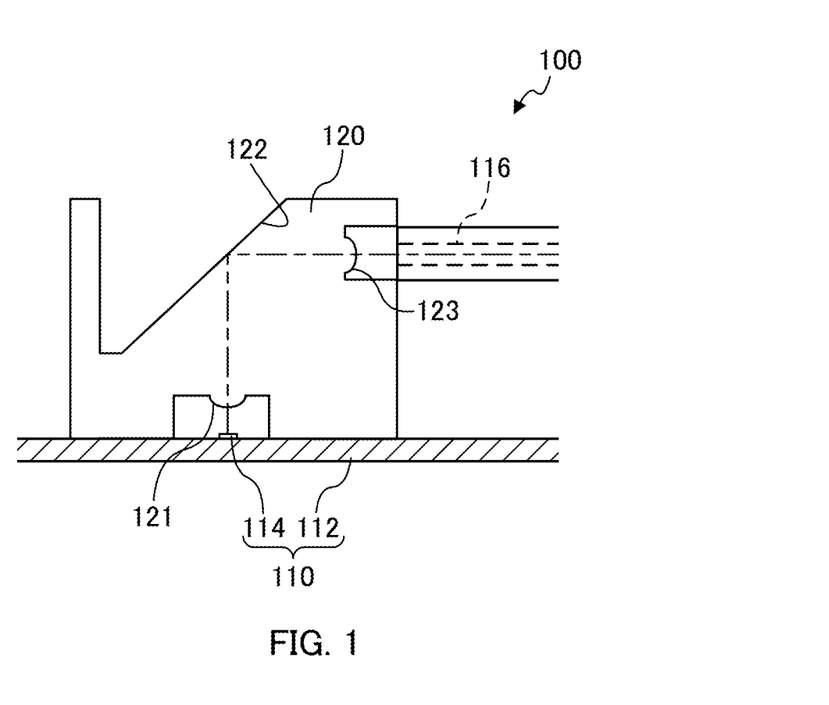
FIG. 1 is a cross-sectional view of an optical module according to an embodiment.
Figure 2A:
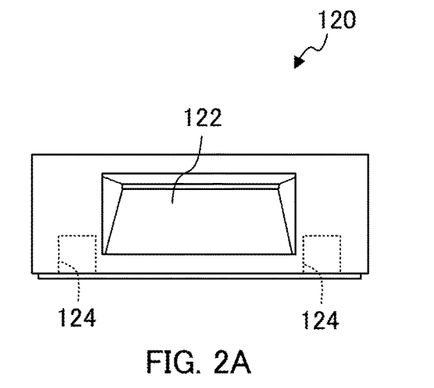
FIGS. 2A to 2E illustrate a configuration of an optical receptacle according to an embodiment.
Figure 2B:
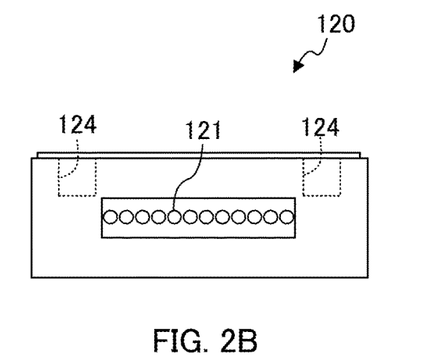
Figure 2C:
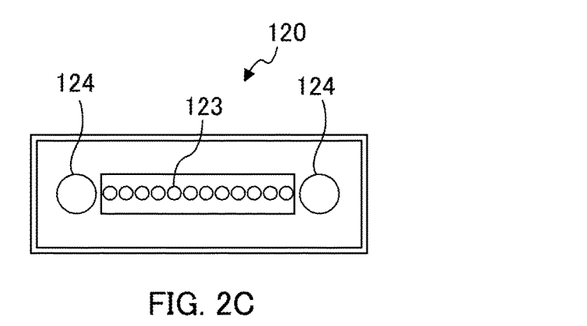
Figure 2D:
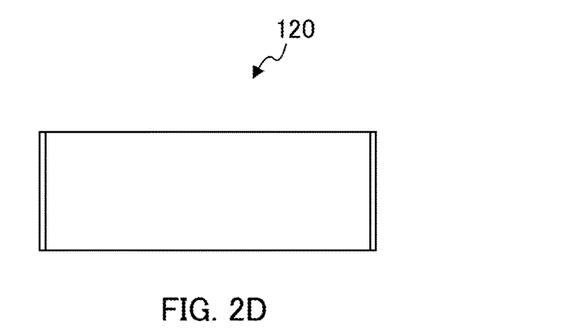
Figure 2E:
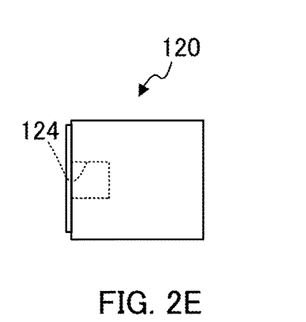

FIG. 1 is a cross-sectional view of optical module 100 according to an embodiment of the present invention. FIG. 1 omits hatching in the cross-section of optical receptacle 120 to show an optical path in optical receptacle 120.

As illustrated in FIG. 1, optical module 100 includes substrate-mounted photoelectric conversion device 110 including light emitting elements 114, and optical receptacle 120. Optical module 100 is used in a state where optical receptacle 120 is connected to a plurality of optical transmission members 116. Optical transmission member 116 is not limited to any particular type and may be an optical fiber or a light waveguide, for example. In the present embodiment, the plurality of optical transmission members 116 is a plurality of optical fibers arranged in a row at a constant interval. The optical fibers may be single-mode optical fibers or multi-mode optical fibers. It is noted that optical transmission members 116 may be arranged in two rows or more.

Photoelectric conversion device 110 includes substrate 112 and a plurality of light emitting elements 114. In the present embodiment, the plurality of light emitting elements 114 are arranged in a row at a constant interval on substrate 112, and configured to emit laser light in the direction perpendicular to the surface of substrate 112. Light emitting element 114 is Vertical Cavity Surface Emitting Laser (VCSEL), for example. It is noted that, when optical transmission members 116 are arranged in two rows or more, light emitting elements 114 are also arranged in the same number of rows.

Optical receptacle 120 optically connects the plurality of light emitting elements 114, respectively, to the end surfaces of the plurality of optical transmission members 116 in the state of being disposed between photoelectric conversion device 110 and optical transmission members 116. Hereinafter, a configuration of optical receptacle 120 will be described in detail.

(Configuration of Optical Receptacle)

FIGS. 2A to 2E illustrate a configuration of optical receptacle 120 according to the embodiment. FIGS. 2A to 2E are, respectively, a plan view, a bottom view, a front view, a rear view and a right side view of optical receptacle 120.

As illustrated in FIGS. 2A to 2E, optical receptacle 120 is a member with the shape of a substantially rectangular parallelepiped. Optical receptacle 120 is light transmissive and configured to emit light emitted from light emitting elements 114 toward the end surfaces of optical transmission members 116. Optical receptacle 120 includes a plurality of first optical surfaces (incidence surfaces) 121, third optical surface (reflection surfaces) 122, a plurality of second optical surfaces (emission surfaces) 123, and a plurality of recesses 124. Optical receptacle 120 is formed of a material that transmits light having a wavelength used for optical communications. Examples of such materials include transparent resins such as polyetherimides (PEI) and cyclic olefin resins. As described later, optical receptacle 120 is produced by injection molding.

First optical surface 121 is an incidence surface that refracts laser light emitted from light emitting element 114 to allow the light to enter inside optical receptacle 120. In the present embodiment, the plurality of first optical surfaces 121 are arranged in a row on the bottom surface of optical receptacle 120 in the longer-side direction so as to face respective light emitting elements 114. First optical surface 121 may be in any shape. The shape of first optical surface 121 is that of convex lens protruding toward light emitting element 114 in the present embodiment. The shape of first optical surface 121 in plan view is a circle. The light incident on first optical surface 121 (incidence surface) propagates toward third optical surface 122 (reflection surface). It is noted that, when light emitting elements 114 are arranged in two rows or more, first optical surfaces 121 are also arranged in the same number of rows.

Third optical surface 122 is a reflection surface that reflects the light incident on first optical surface 121 toward second optical surface 123. Third optical surface 122 is tilted such that the distance from optical transmission member 116 decreases in the direction from the bottom surface to the top surface of optical receptacle 120. The inclination angle of third optical surface 122 relative to the optical axis of light emitted from light emitting element 114 is not particularly limited. It is preferable that the inclination angle of third optical surface 122 is 45° relative to the optical axis of light incident on first optical surface 121. Third optical surface 122 may be in any shape. In the present embodiment, the shape of third optical surface 122 is a flat surface. The light incident on first optical surface 121 is incident on third optical surface 122 at an incident angle larger than the critical angle. Third optical surface 122 totally reflects the incident light toward second optical surface 123. That is, light with a predetermined light flux diameter is incident on third optical surface 122 (reflection surface), and the light with the predetermined light flux diameter is emitted toward second optical surface 123 (emission surface).

Second optical surface 123 is an emission surface that emits the light totally reflected by third optical surface 122 toward the end surface of optical transmission member 116. In the present embodiment, the plurality of second optical surfaces 123 are arranged in a row on the side surface of optical receptacle 120 in the longer-side direction so as to face respective end surfaces of optical transmission members 116. Second optical surface 123 may be in any shape. In the present embodiment, the shape of second optical surface 123 is that of a convex lens protruding toward the end surface of optical transmission member 116. This enables the light with the predetermined light flux diameter reflected by third optical surface 122 to efficiently connect to the end surface of optical transmission member 116. It is noted that, when optical transmission members 116 are arranged in two rows or more, second optical surfaces 123 are also arranged in the same number of rows.

Recesses 124 are for fixing optical transmission members 116 to optical receptacle 120 (to the surface where the plurality of second optical surface 123 are disposed). Optical transmission members 116 can be fixed to the surface of optical receptacle 120 where the plurality of second optical surfaces 123 are disposed by engaging projections of an optical transmission member attachment with respective recesses 124.

The shape and number of recesses 124 are not particularly limited as long as optical receptacle 120 can be fixed to substrate 112. It is sufficient that the shape of recess 124 is complementary to that of the projection of the optical transmission member attachment. In the present embodiment, the shape of recess 124 is cylindrical. The number of recesses 124 is not limited either, as long as optical transmission member 116 can be fixed to optical receptacle 120, and typically more than one recess are formed. In the present embodiment, two recesses 124 are disposed on the surface where the plurality of second optical surfaces 123 are disposed so that the row of second optical surfaces 123 is interposed between two recesses 124 in the longer-side direction.

Next, a method for producing optical module 100 will be described. Optical module 100 can be produced by molding optical receptacle 120 by injection molding, and fixing the molded optical receptacle 120 onto substrate 112 using an adhesive.

The molding of optical receptacle 120 by injection molding will be described. First, a mold is clamped. The number of mold pieces and how to split the mold are not particularly limited as long as the mold used for the injection molding is capable of molding optical receptacle 120 according to the present embodiment. A cavity having the shape complementary to optical receptacle 120 as designed is formed inside the clamped mold. Secondly, a molten resin is injected into the cavity inside the mold. The mold is then cooled naturally with the pressure being held while the molten resin fills the cavity. Lastly, the clamped mold is opened and an optical receptacle (injection molded article) 120 is released from the mold.

Next, a method for fixing optical receptacle 120 to substrate 112 will be described. Optical receptacle 120 is positioned such that the plurality of light emitting elements disposed on the surface of substrate 112 face the plurality of first optical surfaces 121, respectively. Then, an adhesive is applied onto a boundary between substrate 112 and a pair of side surfaces (a surface illustrated in FIG. 2E and a surface opposite thereto) which are both end surfaces of optical receptacle 120 in the longer-side direction to cure the adhesive. For example, when a thermosetting epoxy resin adhesive is used, for example, the adhesive is heated.

According to the foregoing procedure, optical module 100 is produced.

Optical receptacle 120 according to the present embodiment is characterized in that first optical surfaces 121 and third optical surfaces 122 are arranged in consideration of deformation in association with the curing of the adhesive during production of optical module 100. Hereinafter, this feature will be described with reference to FIGS. 3A and 3B to 9A and 9B.

Figure 3A:
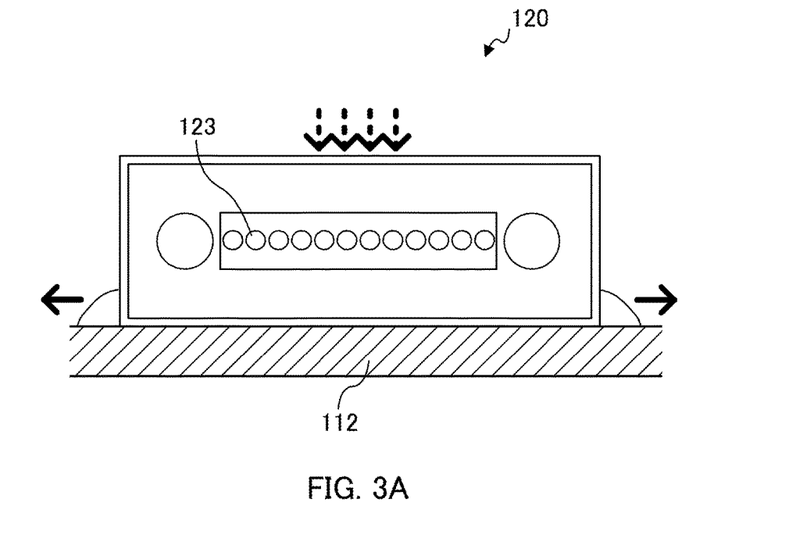
FIGS. 3A and 3B illustrate a deformation of an optical receptacle during curing of an adhesive.
Figure 3B:
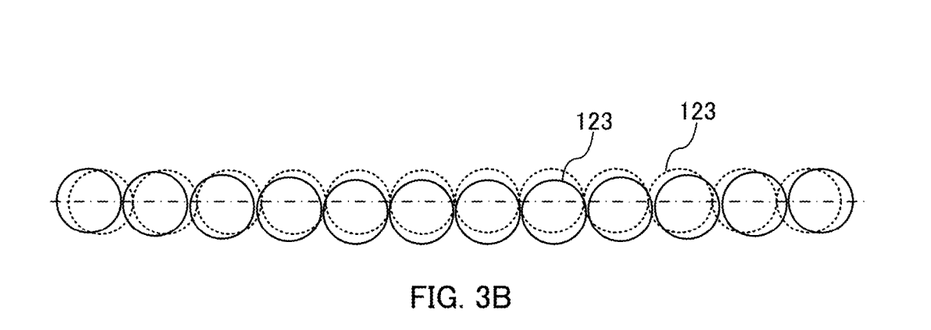

FIGS. 3A and 3B illustrate the deformation of optical receptacle 120 during curing of the adhesive. FIG. 3A illustrates the directions of stresses applied to optical receptacle 120 during the curing of the adhesive, and FIG. 3B illustrates the arrangement of second optical surfaces 123 before and after the curing of the adhesive. The broken line in FIG. 3B illustrates second optical surfaces 123 before the curing of the adhesive. The solid line in FIG. 3B illustrates second optical surfaces 123 after the curing of the adhesive.

As illustrated in FIG. 3A, optical receptacle 120 is pulled toward the disposed adhesive due to shrinkage of the adhesive in association with the curing thereof (see solid line arrows in FIG. 3A). In the present embodiment, the adhesive is in contact with the side surfaces of optical receptacle 120. Accordingly, in association with the shrinkage of the adhesive, force acts on optical receptacle 120 outwardly in the horizontal direction. Further, in association with the shrinkage of the adhesive, force acts on optical receptacle 120 from the top surface to the bottom surface (see broken line arrows in FIG. 3A). This causes the top surface of optical receptacle 120 to be deformed to be convex toward substrate 112. Thus, first optical surfaces 121, second optical surfaces 123, and third optical surface 122 (see FIG. 3B) are pulled outwardly in the lengthwise direction of optical receptacle 120, and are deformed to be disposed in a convex manner toward substrate 112.

Figure 4A:
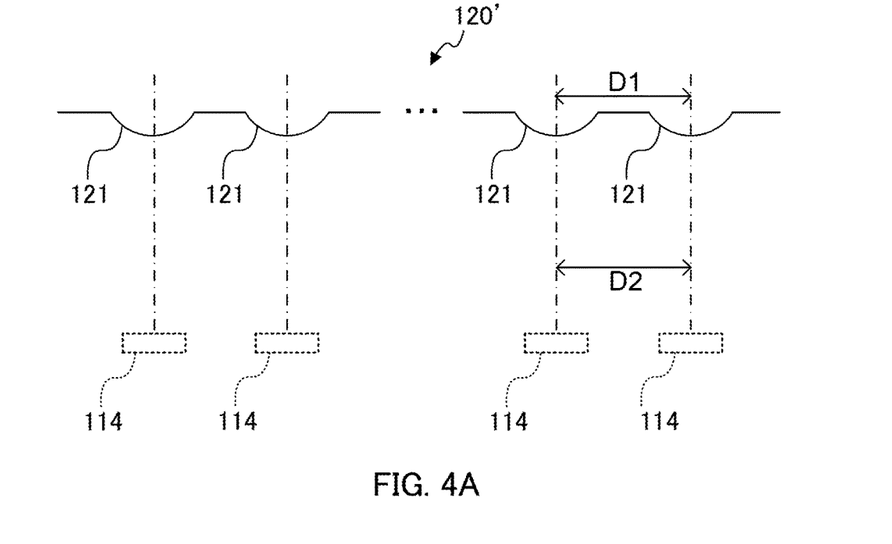
FIGS. 4A and 4B illustrate arrangements of first optical surfaces and second optical surfaces of an optical receptacle of a comparative example before curing of an adhesive.
Figure 4B:
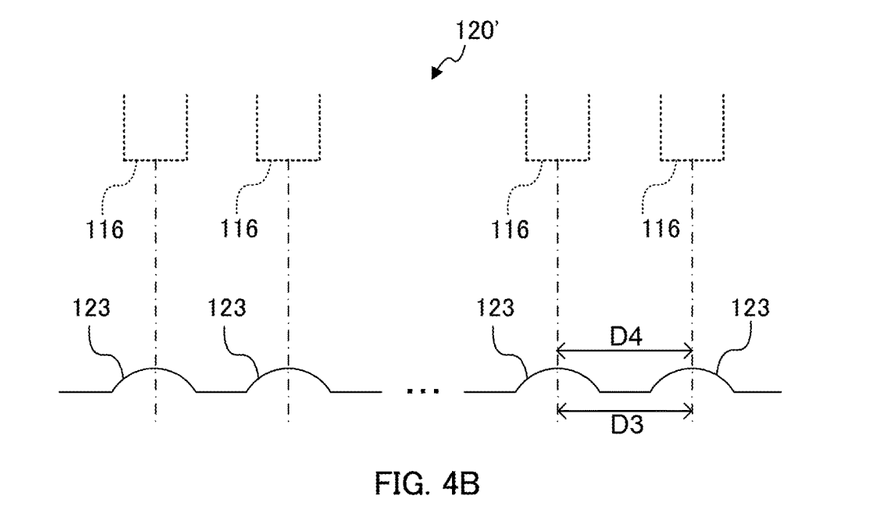

Next, a study was conducted on the degree of deformation of the optical receptacle when the optical receptacle was fixed to substrate 112 using the adhesive. It is noted that the change in the position of second optical surfaces 123 before and after the curing of the adhesive was employed as an index of the deformation of the optical receptacle. Further, as the optical receptacle, optical receptacle 120 according to a comparative example was used instead of optical receptacle 120 according to Embodiment 1. Optical receptacle 120' includes twelve first optical surfaces 121 and twelve second optical surfaces 123. FIGS. 4A and 4B illustrate arrangements of first optical surfaces 121 and second optical surfaces 123 of optical receptacle 120' of the comparative example before being fixed to substrate 112 using the adhesive.

As illustrated in FIG. 4A, in optical receptacle 120' according to the comparative example, center-to-center distance D1 of two adjacent first optical surfaces 121 in a row before curing of the adhesive is the same as distance D2 between optical axes of light emitted from two adjacent light emitting elements 114 which face two adjacent first optical surfaces 121. Further, a plurality of first optical surfaces 121 is disposed on the same plane. That is, in optical receptacle 120' according to the comparative example, the central axis of first optical surface 121 coincides with the optical axis of light emitted from light emitting element 114, in a state before being fixed to substrate 112 using the adhesive. As illustrated in FIG. 4B, in optical receptacle 120' according to the comparative example, center-to-center distance D3 of two adjacent second optical surfaces 123 in a row before curing of the adhesive is the same as center-to-center distance D4 of two adjacent light-receiving surfaces of the optical transmission members 116 which face two adjacent second optical surfaces 123 when being disposed. Furthermore, a plurality of second optical surfaces 123 is disposed on the same plane. That is, in optical receptacle 120' according to the comparative example, the optical axis of light emitted from second optical surface 123 coincides with the central axis of the light-receiving surface of optical transmission member 116 which faces second optical surface 123 when being disposed, in a state before being fixed to substrate 112 using the adhesive.

Figure 5A:
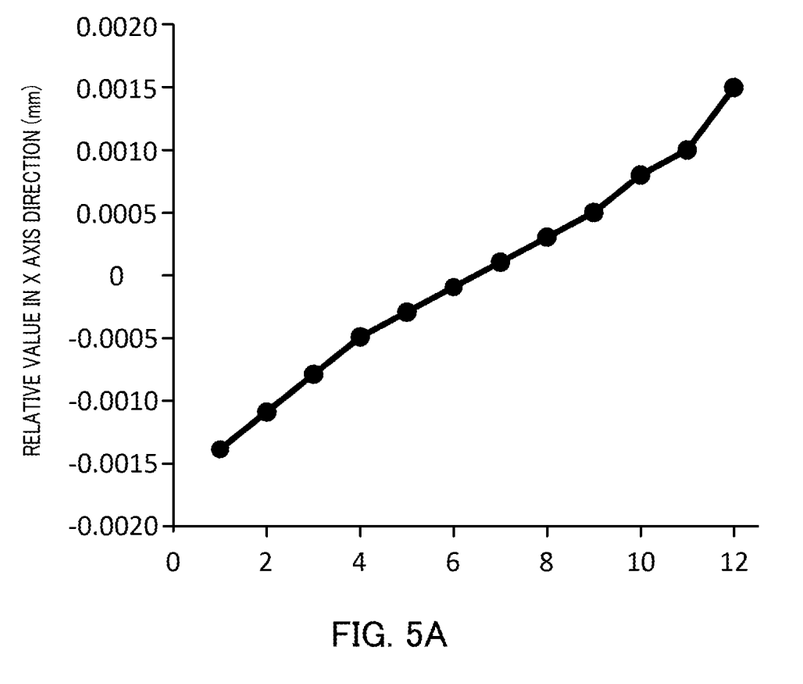
FIGS. 5A and 5B are explanatory diagrams of change in the position of the second optical surfaces before and after the curing of the adhesive.
Figure 5B:
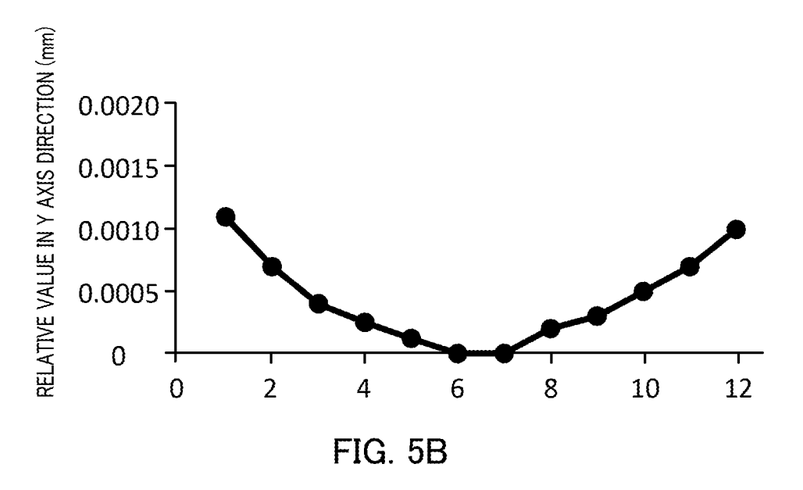

FIGS. 5A and 5B are explanatory diagrams of the positions of second optical surfaces 123 before and after the curing of the adhesive. FIG. 5A is a graph showing the relative value of twelve second optical surfaces 123 in X axis direction in association with the curing of the adhesive. FIG. 5B is a graph showing the relative value of twelve second optical surfaces 123 in Y axis direction in association with the curing of the adhesive. As used herein, "X axis direction" refers to a row direction of second optical surfaces 123 as viewed from the front. As used herein, "Y axis direction" refers to a direction orthogonal to X axis direction. In FIGS. 5A and 5B, the abscissas represent the numbers of second optical surfaces 123. It is noted that No. 1 is assigned to second optical surface 123 positioned at the end, and numbers up to 12 are assigned to the respective second optical surfaces 123. The ordinate in FIG. 5A represents the relative values of second optical surfaces 123 when the centers of sixth second optical surface 123 and seventh second optical surface 123 are set as "0." The ordinate in FIG. 5B represents the relative values of second optical surfaces 123 when the centers of sixth second optical surface 123 and seventh second optical surface 123 are set as "0."

As shown in FIG. 5A, when looking into X axis direction, the second optical surfaces 123 have larger relative values (more distant from the center) in X axis direction in the direction toward both sides of the row in association with curing of the adhesive. It can be found, from this result, that each second optical surface 123 is moved so as to be expanded toward the outside of optical receptacle 120 in association with curing of the adhesive (see FIG. 3B). Further, as shown in FIG. 5B, when looking into Y axis direction, the second optical surfaces 123 have larger relative values (more distant from the center) in Y axis direction in the direction toward both sides of the row in association with curing of the adhesive. It is noted that, in FIG. 5B, since the centers of sixth second optical surface 123 and seventh second optical surface 123 are set as "0," second optical surfaces 123 on both sides appear to be moved upward. It can be found, from this result, that second optical surfaces 123 move such that the distance to the surface of substrate 112 becomes shorter (more convex toward substrate 112) as second optical surface 123 is positioned more inwardly from both sides of the row (see FIG. 3B).

Next, the optical paths of light emitted from light emitting element 114 in the case of fixing optical receptacle 120 according to the comparative example to substrate 112 will be described.

Figure 6A:
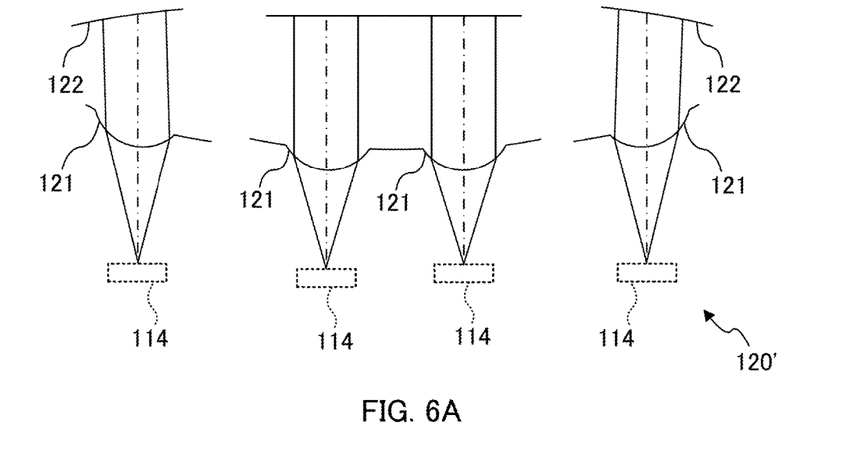
FIGS. 6A and 6B illustrate optical paths of light in the optical receptacle according to the comparative example before and after the curing of the adhesive.
Figure 6B:
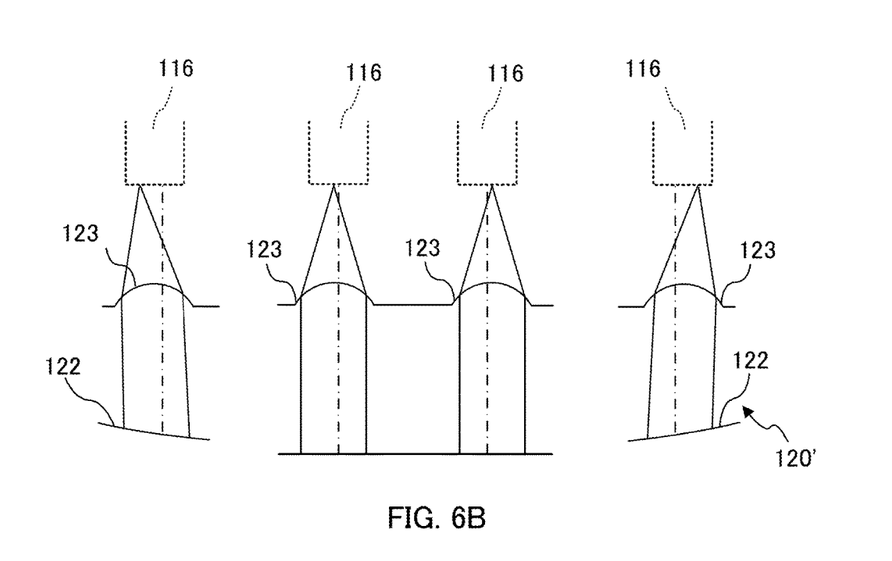

FIGS. 6A and 6B illustrate optical paths of light in optical receptacle 120' of the comparative example fixed using the adhesive. FIG. 6A illustrates the optical paths from light emitting elements 114 to third optical surface 122 in optical receptacle 120, and FIG. 6B illustrates the optical paths from third optical surface 122 to optical transmission members 116 in optical receptacle 120. In FIGS. 6A and 6B, leftmost first optical surface 121, central first optical surfaces 121, and rightmost first optical surface 121 in the drawing sheet correspond, respectively, to leftmost first optical surface 121, central first optical surfaces 121, and rightmost first optical surface 121 in optical receptacle 120' as viewed in plan view.

As illustrated in FIG. 6A, in optical receptacle 120' of the comparative example fixed using the adhesive, the light emitted from leftmost light emitting element 114 is refracted outwardly by first optical surface 121 and enters optical receptacle 120. The light incident on optical receptacle 120' is reflected by third optical surface 122 further outwardly. Further, the light emitted from light emitting elements 114 at the center having less deformation than those at the periphery propagates along the optical axis and enters optical receptacle 120' as it is, and is reflected. Furthermore, the light emitted from rightmost light emitting element 114 is refracted by first optical surface 121 outwardly and enters optical receptacle 120. The light incident on optical receptacle 120' is reflected by third optical surface 122 further outwardly.

Further, as illustrated in FIG. 6B, the light emitted from leftmost light emitting element 114 and reflected by third optical surface 122 is refracted by second optical surface 123 largely outwardly relative to the center of the end surface of optical transmission member 116, to which the light should have reached, and is emitted. The light emitted from central light emitting elements 114 and reflected by third optical surface 122 is refracted by second optical surface 123 slightly outwardly relative to the end surface of optical transmission member 116, to which the light should have reached, and is emitted. The light emitted from rightmost light emitting element 114 and reflected by third optical surface 122 is refracted by second optical surface 123 largely outwardly relative to the center of the end surface of optical transmission member 116, to which the light should have reached, and is emitted. As described above, in optical receptacle 120' of the comparative example after being released from the mold, all the light reaches outward positions compared to the positions to which the light should have reached; therefore, light emitting elements 114 cannot be properly connected to optical transmission members 116.

As described above, optical receptacle 120 according to the comparative example fixed to substrate 112 using the adhesive cannot properly guide light emitted from light emitting elements 114 to optical transmission members 116. Thus, optical receptacle 120 according to the present embodiment is designed as a product, taking account of the deformation due to shrinkage of an adhesive in advance.

Figure 7A:
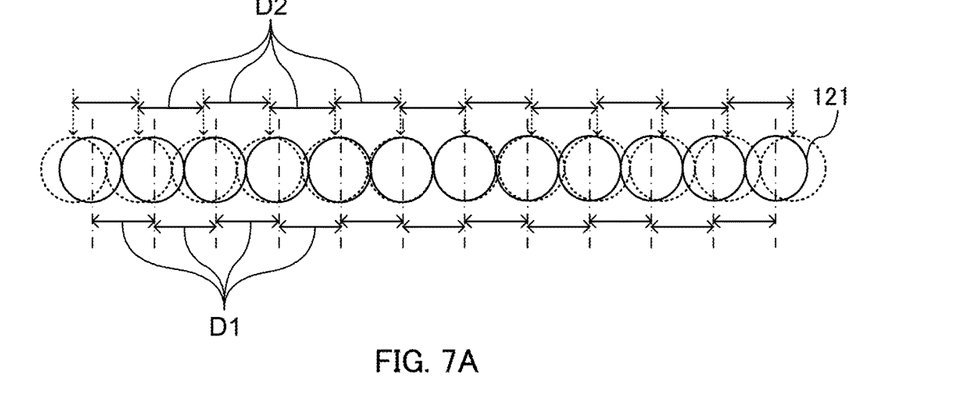
FIGS. 7A and 7B illustrate an arrangement of the first optical surfaces in the optical receptacle according to the embodiment before curing of an adhesive.
Figure 7B:
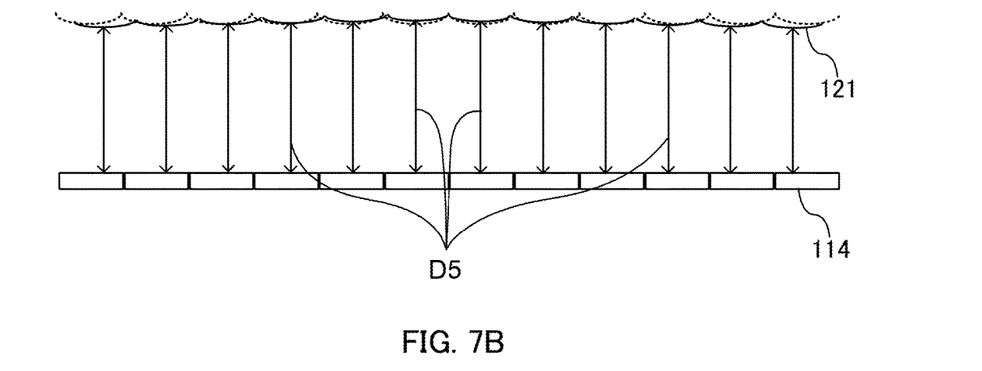
Figure 8A:
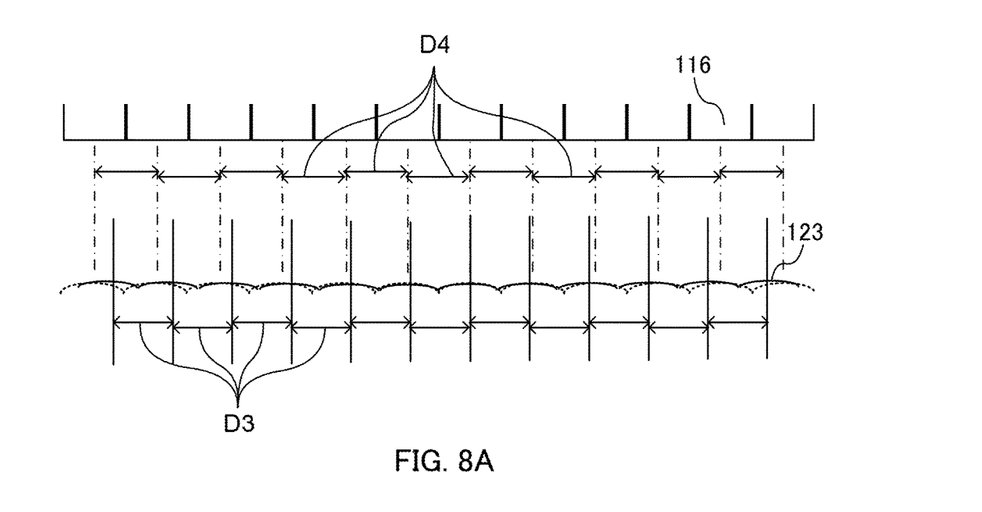
FIGS. 8A and 8B illustrate an arrangement of the second optical surfaces in the optical receptacle according to the embodiment before curing of an adhesive.
Figure 8B:
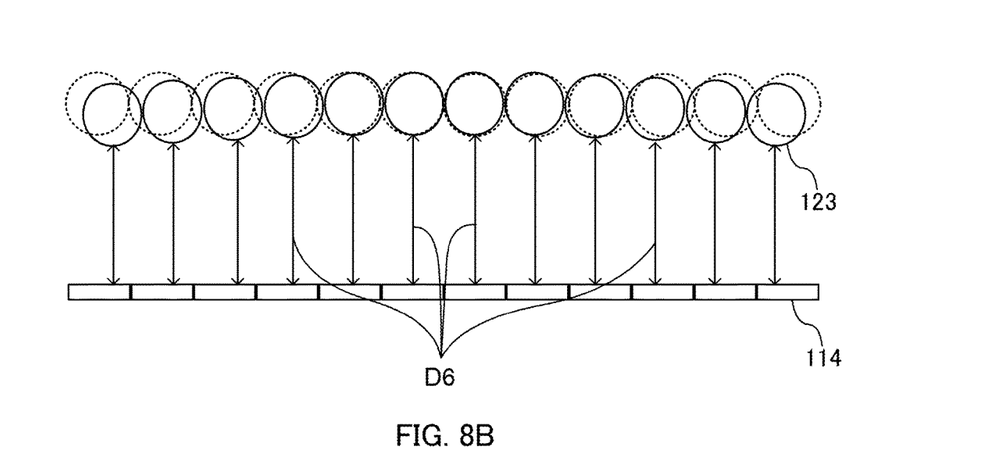

FIGS. 7A and 7B are explanatory drawings of the arrangement of first optical surfaces 121 of optical receptacle 120 according to the present embodiment before being fixed to substrate 112 using an adhesive. FIG. 7A is an explanatory drawing of the arrangement of first optical surfaces 121 as viewed in plan view before curing of the adhesive, and FIG. 7B is an explanatory drawing of the arrangement of first optical surfaces 121 as viewed from the front before curing of the adhesive. The solid lines in FIG. 7A indicate first optical surfaces 121 of optical receptacle 120 before the fixing. The broken lines in FIG. 7A indicate first optical surfaces 121 of optical receptacle 120 after the fixing. The broken line arrows in FIG. 7A indicate the positions of the optical axes of light emitted from light emitting elements 114. Further, the alternate long and short dash lines in FIG. 7A indicate the positions of the centers of first optical surfaces 121 before adhesion. FIGS. 8A and 8B are explanatory drawings of the arrangement of second optical surfaces 123 after being fixed to substrate 112 using an adhesive. FIG. 8A is an explanatory drawing of the arrangement of second optical surfaces 123 as viewed in plan view after curing of the adhesive, and FIG. 8B is an explanatory drawing of the arrangement of second optical surfaces 123 as viewed from the front after curing of the adhesive. The alternate long and short dash lines in FIG. 8A indicate the positions of the centers of the light-receiving surfaces of optical transmission members 116. The solid lines in FIG. 8A indicate second optical surfaces 123 of optical receptacle 120 before the fixing. The broken lines in FIG. 8A indicate second optical surfaces 123 of optical receptacle 120 after the fixing.

As illustrated in FIG. 7A, first optical surfaces 121 are disposed such that, before curing of the adhesive, center-to-center distance D1 of two adjacent first optical surfaces 121 which face light emitting elements 114 when being disposed is shorter than distance D2 between optical axes of light emitted from two adjacent light emitting elements 114 which face first optical surfaces 121 when being disposed. Further, as illustrated in FIG. 7B, before curing of the adhesive, distance D5 between the center of first optical surfaces 121 and light emitting elements 114 is designed such that distance D5 becomes longer toward the center from both ends of the row of first optical surfaces 121.

As illustrated in FIG. 8A, before curing of the adhesive, center-to-center distance D3 of two adjacent second optical surfaces 123 which face optical transmission members 116 when being disposed is designed to be shorter than center-to-center distance D4 of two adjacent light-receiving surfaces of optical transmission members 116 which face second optical surfaces 123 when being disposed, on the side surface on which the plurality of second optical surfaces is disposed. Further, as illustrated in FIG. 8B, before curing of the adhesive, distance D6 between the center of second optical surfaces 123 and a virtual plane including the light-receiving surfaces of light emitting elements 114 is designed such that distance D6 becomes longer toward the center from both ends of the row of second optical surfaces 123.

Figure 9A:
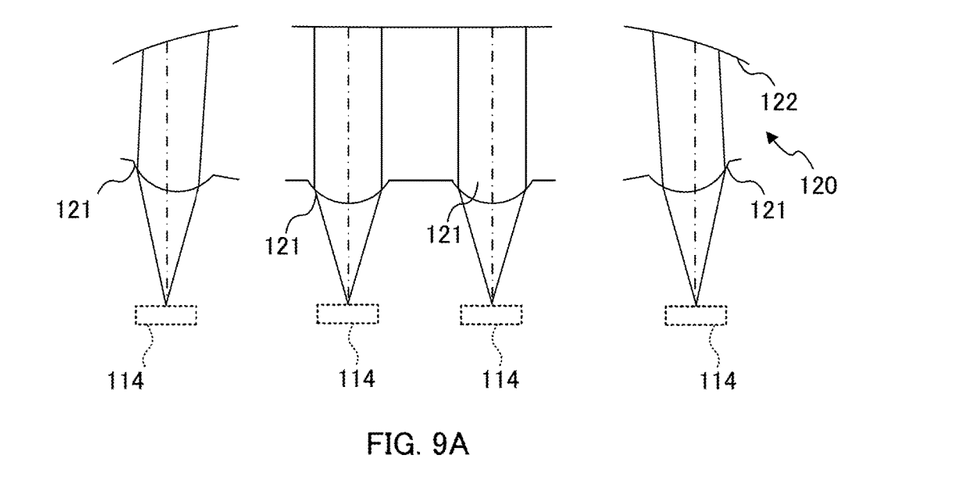
FIGS. 9A and 9B illustrate optical paths of light in the optical receptacle according to the embodiment after the curing of the adhesive.
Figure 9B:
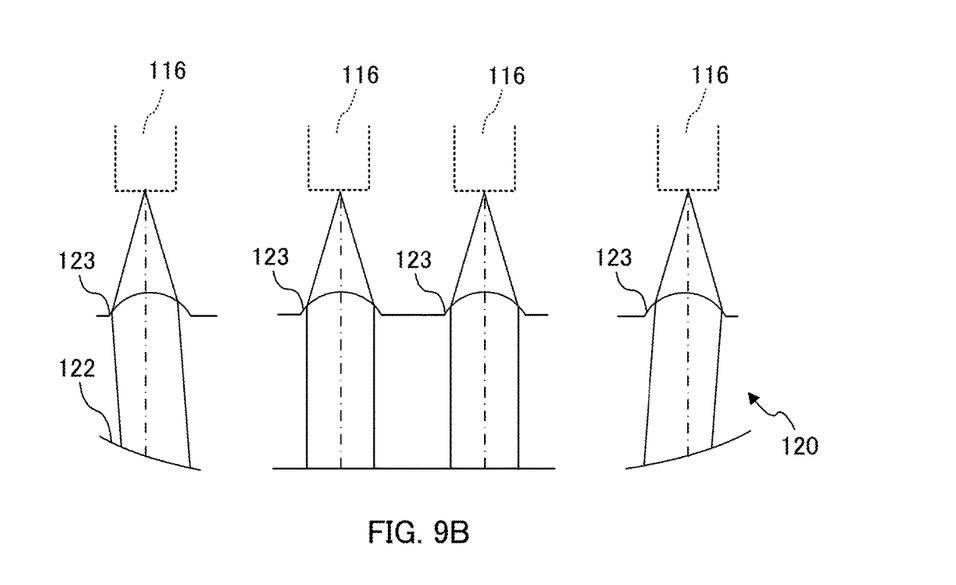

FIGS. 9A and 9B illustrate optical paths of light in optical receptacle 120 after curing of the adhesive. FIG. 9A illustrates the optical paths from light emitting elements 114 to third optical surface 122 in optical receptacle 120 after curing of the adhesive, and FIG. 9B illustrates the optical paths from third optical surface 122 to optical transmission members 116 in optical receptacle 120 after curing of the adhesive. In FIGS. 9A and 9B, leftmost first optical surface 121, central first optical surfaces 121, and rightmost first optical surface 121 in the drawing sheet indicate, respectively, leftmost first optical surface 121, central first optical surfaces 121, and rightmost first optical surface 121 as viewed in FIG. 2B (bottom view).

As illustrated in FIG. 9A, in optical receptacle 120 which is designed as described above and is fixed using the adhesive, the light emitted from leftmost light emitting element 114 is refracted by first optical surface 121 inwardly and enters optical receptacle 120. The light incident on optical receptacle 120 is reflected by third optical surface 122 outwardly. Further, the light emitted from light emitting elements 114 at the center having less deformation than those at the periphery propagates along the optical axis and enters optical receptacle 120 as it is, and is reflected. Furthermore, the light emitted from rightmost light emitting element 114 is refracted by first optical surface 121 inwardly and enters optical receptacle 120. The light incident on optical receptacle 120 is reflected by third optical surface 122 outwardly.

Further, as illustrated in FIG. 9B, the light emitted from leftmost light emitting element 114 and reflected by third optical surface 122 is refracted by second optical surface 123 toward the center of the end surface of optical transmission member 116, and is emitted. The light emitted from central light emitting elements 114 and reflected by third optical surface 122 is refracted by second optical surface 123 toward the center of the end surface of optical transmission member 116, and is emitted. The light emitted from rightmost light emitting element 114 and reflected by third optical surface 122 is refracted by second optical surface 123 toward the center of the end surface of optical transmission member 116, and is emitted. As described above, in optical receptacle 120 according to the present embodiment, by adjusting the arrangement of first optical surfaces 121 and second optical surfaces 123, it becomes possible to optically connect light emitting elements 114 to optical transmission members 116, even when deformation occurs in fixing receptacle 120 to substrate 112 using an adhesive.

(Effects)

As has been described above, in optical receptacle 120 according to the present embodiment, before fixing thereof to substrate 112 using the adhesive, both the distance between the center of first optical surfaces 121 and the virtual plane (light-emitting surfaces of light emitting elements 114) and the distance between second optical surfaces 123 and the virtual plane become longer toward the center from both ends of the row, and center-to-center distance D1 of first optical surfaces 121 and center-to-center distance D3 of second optical surfaces 123 are shorter, respectively, than the distance between optical axes of light emitted from light emitting elements 114 and center-to-center distance D4 of light-receiving surfaces of optical transmission members 116. Accordingly, optical receptacle 120 according to the present embodiment is capable of optically connecting light emitting elements 114 properly to optical transmission members 116, even when deformation occurs due to fixing of receptacle 120 to substrate 112 using an adhesive.

In optical receptacle 120 according to the above-described embodiment, first optical surface 121 and second optical surface 123 are convex lenses, but first optical surface 121 and second optical surface 123 may be a flat surfaces. Specifically, only first optical surface 121 may be a flat surface, or only second optical surface 123 may be a flat surface. When first optical surface 121 is formed as a flat surface, third optical surface 122 is formed to function as a concave mirror, for example. When light immediately before reaching second optical surface 123 is effectively converged by first optical surface 121 or third optical surface 122, for example, second optical surface 123 may be formed as a flat surface.

Further, optical receptacle 120 according to the above-described embodiment may also be used for an optical module on receiving side. In this case, the optical module for reception includes a plurality of light receiving elements for receiving light, instead of a plurality of light emitting elements 114. The light receiving elements are arranged at the same positions as the respective corresponding light emitting elements. The optical module for reception has second optical surfaces 123 as incidence surfaces, and first optical surfaces 121 as emission surfaces. Light emitted from the end surface of optical transmission member 116 enters the optical receptacle from second optical surface 123. Then, the light entered the optical receptacle is reflected by third optical surface 122, and is emitted from first optical surface 121 toward the light receiving element. In this case, the distance between the center of first optical surfaces 121 and the light-receiving surfaces of light receiving elements and the distance between the center of second optical surfaces 123 and the light-receiving surfaces of light receiving elements are designed to be longer toward the center from both ends of the row of first optical surfaces 121 and the rows of second optical surfaces 123, respectively; and center-to-center distance D1 of two adjacent first optical surfaces 121 and center-to-center distance D3 of two adjacent second optical surfaces 123 are designed to be shorter, respectively, than the distance between optical axes of light emitted from two adjacent optical transmission members 116 and center-to-center distance D4 of light-receiving surfaces of two adjacent light-receiving surfaces of light receiving elements.

This application is entitled to and claims the benefit of Japanese patent Application No. 2014-031511, filed on Feb. 21, 2014, the disclosure of which including the specification, drawings and abstract is incorporated herein by reference in its entirety.

INDUSTRIAL APPLICABILITY

The optical receptacle and optical module according to the present invention are advantageous for optical communications using optical transmission members.

REFERENCE SIGN LIST

100 Optical module
110 Photoelectric conversion device
112 Substrate
114 Light emitting element
116 Optical transmission member
120, 120' Optical receptacle
121 First optical surface (Incidence surface)
122 Third optical surface (Reflection surface)
123 Second optical surface (Emission surface)
124 Recess

The invention claimed is:

1. An optical receptacle disposed between a plurality of light emitting elements or a plurality of light receiving elements arranged at a constant interval and a plurality of optical transmission members arranged at a constant interval and configured to optically connect the light emitting elements or the light receiving elements to end surfaces of the optical transmission members, respectively, the optical receptacle comprising:

a plurality of first optical surfaces arranged correspondingly to the light emitting elements or the light receiving elements, the plurality of first optical surfaces each configured such that light emitted from a corresponding one of the light emitting elements is incident on the first optical surface, or each configured to emit light propagating in the first optical surface toward a corresponding one of the light receiving elements;

a plurality of second optical surfaces arranged correspondingly to the optical transmission members, the plurality of second optical surfaces each configured to emit the light incident on the first optical surfaces toward an end surface of a corresponding one of the optical transmission members, or each configured such that light from a corresponding one of the optical transmission members is incident on the second optical surface; and a third optical surface configured to reflect the light incident on the first optical surface toward the second optical surface or configured to reflect the light incident on the second optical surface toward the first optical surface, wherein:

a distance between a center of the first optical surface and a virtual plane positioned identically with a light-emitting surface of the light emitting element or with a light-receiving surface of the light receiving element and a distance between a center of the second optical surface and the virtual plane are longer toward a center from both ends of a row of the first optical surfaces and a row of the second optical surfaces, respectively, and a center-to-center distance of an adjacent two of the first optical surfaces in a direction of the row of the first optical surfaces and a center-to-center distance of an adjacent two of the second optical surfaces in a direction of the row of the second optical surfaces are shorter than a distance between optical axes of light emitted from an oppositely-disposed adjacent two of the light emitting elements and a center-to-center distance of an oppositely-disposed adjacent two of the light-receiving surfaces of the optical transmission members, or shorter than a distance between optical axes of light emitted from an oppositely-disposed adjacent two of the optical transmission members and a center-to-center distance of an oppositely-disposed adjacent two of the light-receiving surfaces of the light receiving elements.

2. An optical module comprising:

a substrate on which a plurality of light emitting elements or a plurality of light receiving elements are arranged at a constant interval; and the optical receptacle according to claim 1 adhered onto the substrate at a contact point with the substrate.

* * * * *